United States Patent
Liu et al.

(10) Patent No.: US 9,344,100 B2
(45) Date of Patent: May 17, 2016

(54) RECONFIGURABLE LOCAL OSCILLATOR FOR OPTIMAL NOISE PERFORMANCE IN A MULTI-STANDARD TRANSCEIVER

(75) Inventors: Li Liu, San Diego, CA (US); Chiewcharn Narathong, San Diego, CA (US); Prasad Srinivasa Siva Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 385 days.

(21) Appl. No.: 12/898,104

(22) Filed: Oct. 5, 2010

(65) Prior Publication Data

US 2012/0082151 A1    Apr. 5, 2012

(51) Int. Cl.
| | | |
|---|---|---|
| H04B 7/216 | (2006.01) | |
| H03L 7/197 | (2006.01) | |
| H03L 7/093 | (2006.01) | |
| H03L 7/099 | (2006.01) | |
| H03L 7/10 | (2006.01) | |
| H03B 5/12 | (2006.01) | |
| H04B 1/00 | (2006.01) | |

(52) U.S. Cl.
CPC ............ *H03L 7/1976* (2013.01); *H03B 5/1212* (2013.01); *H03B 5/1228* (2013.01); *H03B 5/1243* (2013.01); *H03L 7/093* (2013.01); *H03L 7/099* (2013.01); *H03L 7/104* (2013.01); *H04B 1/0057* (2013.01)

(58) Field of Classification Search
USPC ............. 327/156, 157; 331/16, 117; 370/277, 370/280, 281; 375/259, 296, 376
See application file for complete search history.

(56) References Cited

U.S. PATENT DOCUMENTS

| | | | |
|---|---|---|---|
| 5,519,887 A | 5/1996 | Lieu | |
| 6,819,197 B2 | 11/2004 | Maldonado | |
| 6,954,091 B2 * | 10/2005 | Wurzer | 327/156 |
| 7,042,972 B2 | 5/2006 | Fahim | |
| 7,323,944 B2 | 1/2008 | Florescu et al. | |
| 7,561,645 B2 | 7/2009 | Stuart et al. | |
| 7,755,437 B2 | 7/2010 | Ballantyne et al. | |
| 8,044,723 B2 | 10/2011 | Kim et al. | |
| 2005/0206463 A1 | 9/2005 | Godambe et al. | |

(Continued)

FOREIGN PATENT DOCUMENTS

EP    1988628 A1    11/2008

OTHER PUBLICATIONS

International Search Report and Written Opinion—PCT/US2011/054974—ISA/EPO—May 9, 2012.

*Primary Examiner* — Chi H Pham
*Assistant Examiner* — Raul Rivas
(74) *Attorney, Agent, or Firm* — Liberty E. Mann

(57) ABSTRACT

A transceiver for multi-standard operation (usable, for example, to communicate signals both of a first wireless communication standard and of a second wireless communication standard) has a mixer that receives a local oscillator signal generated by a local oscillator. A PLL of the local oscillator involves a VCO, a digitally programmable analog loop filter, a digitally programmable VCO supply voltage circuit, and a digitally programmable VCO varactor bias control circuit. In one aspect, the bandwidth of the analog loop filter is adjusted depending on the communication standard of the signal being communicated. In other aspects, the VCO supply voltage circuit and/or the varactor bias control circuit are configured in different ways to optimize PLL performance depending on the communication standard of the signal being communicated.

23 Claims, 13 Drawing Sheets

(56) References Cited

U.S. PATENT DOCUMENTS

2005/0264335 A1 12/2005 Soe
2009/0072912 A1* 3/2009 Kim et al. .................. 331/16
2009/0295492 A1 12/2009 Finocchiaro
2010/0073051 A1* 3/2010 Rao et al. .................. 327/157
2010/0231310 A1 9/2010 Wang et al.
2011/0248787 A1* 10/2011 Jiang .................. 331/117 FE

* cited by examiner

MULTI-STANDARD CELLULAR TELEPHONE

DIGITALLY PROGRAMMABLE ANALOG LOOP FILTER
HAVING PROGRAMMABLE FILTER BANDWIDTH

LOOP BANDWIDTH OF CLOSED LOOP PHASE NOISE

| STANDARD | NBWLF | ZERO LOCATION | POLE LOCATION | LOOP BANDWIDTH OF CLOSED LOOP PHASE NOISE | DSM NOISE CONTRIBUTION |
|---|---|---|---|---|---|
| CDMA1X | 1 | 6.6 KHz | 139.3 KHz | 20 KHz | LOWER |
| GSM | 0 | 13.3 KHz | 278 KHz | 120 KHz | HIGHER |
| WCDMA | 0 | 13.3 KHz | 278 KHz | 120 KHz | HIGHER |

LOOP FILTER SETTINGS

| STANDARD | MC1 | MC2 | OTA | VDD SOURCE | REGULATED VCO SUPPLY VOLTAGE | NOISE OF SUPPLY VOLTAGE SUPPLIED TO VCO | POWER |
|---|---|---|---|---|---|---|---|
| CDMA1X | 1 | 0 | BYPASS IT | DRAW FROM VDD2 | 1.7 | LOWER NOISE | HIGHER POWER |
| GSM | 1 | 0 | USE IT | DRAW FROM VDD2 | 1.7 | LOWER NOISE | HIGHER POWER |
| WCDMA | 0 | 1 | USE IT | DRAW FROM VDD1 | 1.1 | HIGHER NOISE | LOWER POWER |

VCO SUPPLY VOLTAGE CIRCUIT

FIG. 10

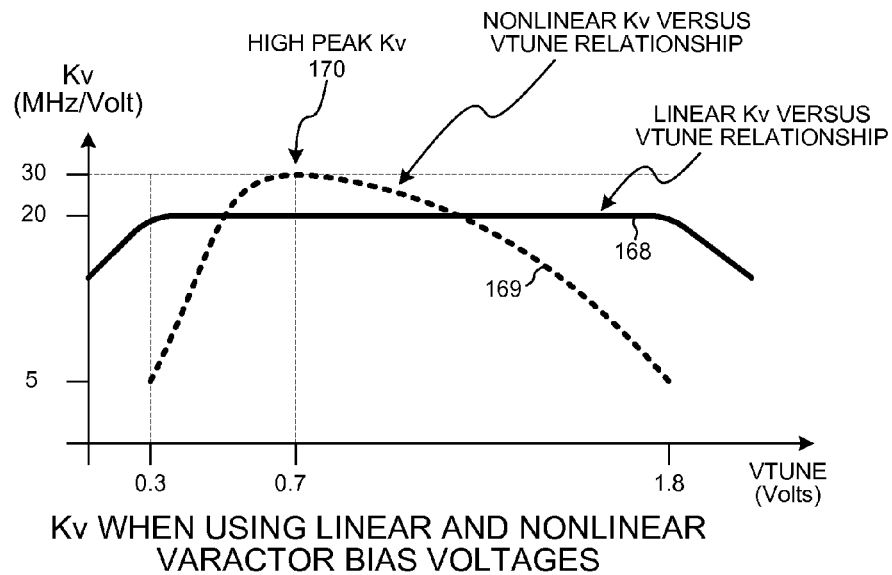

Kv WHEN USING LINEAR AND NONLINEAR
VARACTOR BIAS VOLTAGES

FIG. 12

| STANDARD | LEN | VBIAS1, 2, 3 | PEAK Kv | LINEAR/ NONLINEAR? |
|---|---|---|---|---|
| CDMA1X | 0 | 0.7V, 0.7V, 0.7V | 30 MHz/VOLT | NONLINEAR |
| GSM | 1 | 1.2V, 0.7V, 0.2V | 20 MHz/VOLT | LINEAR |
| WCDMA | 1 | 1.2V, 0.7V, 0.2V | 20 MHz/VOLT | LINEAR |

LINEAR VERSUS NON-LINEAR
VARACTOR BIAS VOLTAGE

FIG. 13

| STANDARD | NBW | BIAS FILTER BAND WIDTH | VCO SETTLING TIME | BIAS NOISE GOING INTO VARACTOR |
|---|---|---|---|---|
| CDMA1X | 1 | NARROWER | SLOWER | LOWER |
| GSM | 0 | WIDER | FASTER | HIGHER |
| WCDMA | 0 | WIDER | FASTER | HIGHER |

VARACTOR BIAS FILTER SETTINGS

FIG. 14

EFFECT OF CHANGING THE RESISTANCE OF THE
PROGRAMMABLE VARACTOR BIAS RESISTOR CIRCUIT

| STANDARD | RB | RESISTANCE OF PROGRAMMABLE VARACTOR BIAS RESISTOR | VCO PHASE NOISE |
|---|---|---|---|
| CDMA1X | 1 | 2K OHMS | LOWER AT 1.25MHz OFFSET |
| GSM | 1 | 2K OHMS | LOWER AT 400 KHz OFFSET |
| WCDMA | 0 | 100K OHMS | LOWER AT 45M/80M/190M Hz OFFSET |

TWO RESISTANCE SETTINGS OF THE PROGRAMMABLE
VARACTOR BIAS RESISTOR CIRCUIT

| | UNITS | CDMA1X CONFIG. | GSM CONFIG. | WCDMA CONFIG. |
|---|---|---|---|---|
| NBWLF | DIGITAL | 1 | 0 | 0 |
| MC1 | DIGITAL | 1 | 1 | 0 |
| MC2 | DIGITAL | 0 | 0 | 1 |
| LEN | DIGITAL | 0 | 1 | 1 |
| NBW | DIGITAL | 1 | 0 | 0 |
| RB | DIGITAL | 1 | 1 | 0 |
| VCO PHASE NOISE | dBc/Hz | -130 AT 1.25MHZ | -153 AT 20MHz | -158 AT 80MHz |
| VCO SETTLING TIME | | <+/-1kHz in 1ms | <0.05ppm in 100us | <0.05ppm in 100us |
| VCO Kv (PEAK Kv) | MHz/Volt | 30 | 20 | 20 |
| OTA OF THE VCO SUPPLY VOLTAGE CIRCUIT | | BYPASS IT | USE IT | USE IT |
| NOISE OF THE VCO SUPPLY VOLTAGE CIRCUIT (AS SUPPLIED TO VCO @ 1.25MHz) | | 0.1 dB | 0.3 dB | 0.5 dB |
| VDD SOURCE OF THE VCO SUPPLY VOLTAGE CIRCUIT | VOLTS | >2.1 | >1.3 | >2.1 |
| REGULATED VARACTOR BIAS VOLTAGE | VOLTS | 1.7 | 1.7 | 1.1 |
| POWER CONSUMPTION OF THE VCO VOLTAGE SUPPLY CIRCUIT | MILLI WATTS | 50 | 30 | 10 |
| VARACTOR BIAS RESISTOR | OHMS | 2K OHMS | 2K OHMS | 100K OHMS |
| LINEAR/NONLINEAR Kv VERSUS VTUNE | | NONLINEAR | LINEAR | LINEAR |
| | | | | |
| BANDWIDTH OF THE CLOSED LOOP VCO PHASE NOISE | KHz | 20 | 120 | 120 |

LOCAL OSCILLATOR CONFIGURATION AND OPERATION WHEN
THE TRANSCEIVER IS COMMUNICATING CDMA1X SIGNALS,
GSM SIGNALS, AND WCDMA SIGNALS

FIG. 17

US 9,344,100 B2

RECONFIGURABLE LOCAL OSCILLATOR FOR OPTIMAL NOISE PERFORMANCE IN A MULTI-STANDARD TRANSCEIVER

BACKGROUND

1. Technical Field

The present disclosure relates to reconfigurable PLLs within local oscillators, where the local oscillators are usable in multi-standard transceivers.

2. Background Information

In the early days of cellular telephone technology, a given cellular telephone generally communicated using only one cellular telephone standard. For example, there were cellular telephones that used the GSM (Global System for Mobile Communications) standard and there were cellular telephones that used the CDMA (Code Division Multiple Access) standard. Over time cellular telephone technology evolved. The corresponding standards evolved as well. Cellular telephones became more complex and came to have more and more functionality and processing power. A cellular telephone handset nowadays may include circuitry for communicating using many different wireless communication technologies of different types. Recently cellular telephones have been introduced that can use multiple different completing cellular telephone technologies. Such a cellular telephone may, for example, be able to engage in a cellular telephone communication using the GSM standard in one environment, and then may be able to reconfigure itself so that it can then engage in a cellular telephone communication using another standard such as CDMA1× or WCDMA in another environment. One way to provide such multi-standard functionality was to package one radio for communicating using one standard along with another radio for communicating using another standard. Each of the two radios had its own local oscillator that had particular performance characteristics suitable for the standard used by the radio. Another way to provide such multi-standard functionality is for both of the radios to share certain portions of their circuitry. For example rather than providing one local oscillator for use with one standard and other local oscillator for use with another circuit, versatile Digitally Controlled Oscillator (DCO)-based local oscillators have come to be used. In such a multi-standard system, a single DCO-based local oscillator might be configured in a first way to support communications using one standard and might be configured in a second way to support communication using a second standard. Although DCO-based multi-standard designs work adequately well in may applications, further improvements in the design of multi-standard cellular telephones are desired.

SUMMARY

It has been recognized that DCO-based local oscillators suffer from nonlinearity and spur problems when used in multi-standard cellular telephone applications. A reconfigurable analog PLL-based local oscillator is therefore provided in a multi-standard cellular telephone transceiver. This reconfigurable local oscillator supplies a local oscillator signal to a mixer of the transceiver so that the same local oscillator and the same mixer are usable in the communication of signals in multiple different cellular telephone standards. For example, in one embodiment, the same receive local oscillator and the same downconverting mixer may be used in the receiving of a first signal of a first standard and in the receiving of a second signal of a second standard. For example, in a second embodiment, the same transmit local oscillator and the same upconverting mixer may be used in the transmission of a first signal of a first standard and in the transmission of a second signal of a second standard. In one example, the first and second standards are two different standards taken from the group: a GSM standard, a CDMA1× standard, and a WCDMA standard.

In a first novel aspect, a reconfigurable analog PLL within the local oscillator includes a digitally programmable analog loop filter and a VCO. The bandwidth of the digitally programmable analog loop filter is digitally programmable so that it can have a first bandwidth when the transceiver is communicating signals of a first standard and so that it can have a second bandwidth when the transceiver is communicating signals of a second standard. For example, for CDMA1×, the phase noise requirement at 1.25 MHz is very stringent (e.g. less than −130 dBc at VCO frequency for PCS band). This requires that the loop filter significantly reduce the noise coming from other blocks of the PLL (e.g. noise from delta-sigma modulator). In order to achieve that, the loop filter bandwidth is set to be quite narrow (e.g. 20 KHz), which increases PLL lock time. Such an increase in PLL lock time is, however, tolerable in a CDMA1× system. Loop filter bandwidth can be adjusted by the zero and pole location of the loop filter as well as other parameters in the PLL (e.g., charge pump current). On the other hand, for GSM, the PLL should settle fast with a moderate spot phase noise requirement at 400 KHz offset. The analog loop filter is therefore set to be wide (e.g. 120 KHz). This can be achieved by changing the analog loop filter zero and pole location, as well as the other parameters of PLL. In addition, the loop bandwidth also impacts the in-band phase noise of the PLL. For example, a wide loop bandwidth can help improve the in-band integrated phase noise (e.g. GSM requires lower in-band integrated phase noise than CDMA1×).

In a second novel aspect, the reconfigurable analog PLL within the local oscillator includes a digitally programmable VCO supply voltage circuit. The digitally programmable VCO supply circuit supplies a regulated supply voltage to the VCO. The digitally programmable VCO supply voltage circuit can be programmed so that it draws power from a first supply voltage conductor and supplies the VCO with a first regulated VCO supply voltage when the transceiver is communicating signals of the first standard, and so that it draws power from a second supply voltage conductor and supplies the VCO with a second regulated VCO supply voltage when the transceiver is communicating signals of the second standard. The digitally programmable VCO supply voltage circuit may optionally include a second stage involving an Operational Transconductance Amplifier (OTA). The second stage is in the path of the supply current supplied to the VCO. The OTA stage can be enabled and used to provide better voltage supply rejection to the VCO or the OTA stage can be disabled and bypassed to reduce noise in the regulated voltage as supplied to the VCO. Whether the OTA stage is used or is not used is digitally programmable so that the OTA can be used when the transceiver is communicating signals of the first standard, and so that the OTA can be bypassed when the transceiver is communicating signals of the second standard.

In a GSM or WCDMA application, the two stage configuration involving the enabled OTA is used to improve voltage regulator supply rejection. The OTA, however, introduces noise into the regulated VCO supply voltage and therefore contributes to VCO phase noise. Accordingly, for a CDMA1× application where achieving ultra low phase noise at specific offset (1.25 MHz for PCS band and 0.9 MHz for Cell band) is important, the OTA is disabled and bypassed. Furthermore, a GSM or WCDMA system typically does not have as stringent spot noise requirements as does a CDMA1× system. Accordingly, in a GSM/WCDMA configuration the digitally programmable VCO supply voltage circuit is made to draw power from the lower supply voltage conductor to reduce power consumption, whereas in a CDMA1× configuration the digitally programmable VCO supply voltage circuit is made to draw power from the higher supply voltage conductor so that the VCO will have a higher output voltage swing and lower VCO phase noise. Very often, the system may have different noise and spurs on the two regulators described in the previous paragraph due to different power grid configurations between RF transceivers, digital baseband ICs, power management IC or application processors. The flexibility of switching between first supply regualator and the second supply regulator can help the PLL/VCO achieve optimum noise and spur performance for a multi-standard system (e.g. GSM/WCDMA/CDMA1×) based on different chip configurations.

In a third novel aspect, the reconfigurable analog PLL within the local oscillator includes a digitally programmable VCO varactor bias control circuit. The digitally programmable VCO varactor bias control circuit can be programmed so that it supplies a set of varactor bias voltages to a corresponding set of varactor portions of a main varactor circuit of the VCO. Each of these varactor bias voltages is supplied through a separate digitally programmable low pass filter. These low pass filters are digitally programmable so that they can be programmed in a first way when the transceiver is communicating signals of the first standard, and so that they can be programmed in a second way when the transceiver is communicating signals of the second standard.

In a GSM system the local oscillator signal should generally settle within 0.05 ppm in 100 us. The VCO and its sub-block of the GSM system therefore should settle even faster so that VCO settling time does not impact the total frequency settling time of the local oscillator. Having a wide bandwidth of the VCO varactor bias low pass filters facilitates fast VCO settling, but there is an associated penalty of degrading noise due to less filtering of noise in the varactor bias voltage. In a CDMA1× system, VCO settling time requirements are generally relatively relaxed. Accordingly, in the GSM/WCDMA configurations the varactor bias low pass filters are made to have a wider bandwidth to increase settling time, whereas in the CDMA1× configuration the varactor bias low pass filter are made to have a narrower bandwidth to reduce noise in the varactor bias voltage as much as possible.

In a fourth novel aspect, the digitally programmable VCO varactor bias control circuit can be programmed so that the varactor bias voltages supplied to the various varactor portions of the main varactor circuit can be made to have different bias voltages depending on the communication standard being employed. For example, the varactor bias voltages supplied to the main varactor circuit may made to have different voltages (for example, the varactor bias voltages may be spread evenly in voltage between ground potential and a reference voltage) when the transceiver is communicating signals of the first standard whereas the varactor bias voltages may be made to all be the same voltage (for example, a voltage midway between ground and the reference voltage) when the transceiver is communicating signals of the second standard.

In a GSM system where two-point modulation is used, the relationship of VCO gain Kv to changes in the fine tuning varactor signal should be linear. This generally requires that the VCO varactor be linearized. Linearizing the varactor results in a lower peak Kv as compared to the non-linearized case, assuming the same varactor integrated circuit area. CDMA1× and WCDMA systems, as compared to GSM systems, typically do not require Kv to be linear over the range of the fine tuning varactor signal. VCOs including such a non-linearized varactor can therefore generally achieve a higher Kv gain for the same amount of circuit area. Such a higher Kv is beneficial in that it improves PLL locking in the event of temperature drift and other PLL disturbances. Accordingly, in a GSM configuration the set of varactor bias voltages are controlled to have different values so that the VCO gain Kv is linear, whereas in the CDMA1× and WCDMA configurations all the varactor bias voltages as supplied by the digitally programmable VCO varactor bias control circuit are the same.

In a fifth novel aspect, the digitally programmable VCO varactor bias control circuit supplies the bias voltages to the various varactor portions of the main varactor circuit through varactor bias resistors. These varactor bias resistors are digitally programmable so that they can have a first resistance when the transceiver is communicating signals of the first standard whereas they can have a second resistance when the transceiver is communicating signals of the second standard.

To reduce the amount of integrated circuit area consumed supplying the DC varactor bias voltages to the VCO varactors, resistors are used rather than inductors. The resistance where minimum phase noise is achieved, however, is different depending on phase noise offset. This phenomenon can be explained in the following way. When the varactor is AC coupled to the VCO tank by a capacitance Ccouple, the varactor (or VCO buffer) is biased by a resistance $R_b$. However, the bias resistance $R_b$ contributes noise by lowering the Q of the tank and by contributing noise from the AC coupling capacitor and varactor. The VCO phase noise can be modeled empirically as follows:

$$PN = 10\log\left(\frac{\left(\left(1+\left(\frac{f_0}{2Q_{eff}f}\right)^2\right)\frac{2FKT}{P_{ac}}\left(1+\frac{f_c}{f}\right)\right)}{\left(1+\frac{4KTR_b}{1+(2\pi fR_b(C_{couple}+C_{var}))^2}K_{vco}^2\right)}\right) \quad \text{(Eq. 1)}$$

where $$Q_{eff} = \frac{R_bR_p}{R_b+R_p}\frac{1}{\omega_0 L} \quad \text{(Eq. 2)}$$

$$A = \frac{2}{\pi}I_{bias}R_{eff} \quad \text{(Eq. 3)}$$

In the equations above, $F=1+\gamma$, and $f_c$ is the flicker corner, $P_{ac}$ 0.5$A^2/R_p$, Ccouple and Cvar are the AC coupling and varactor capacitances, and $\gamma$ is an empirical fitting factor, and $R_p$ is the parallel impedance of the tank. The noise contribution mechanism is explained with the following comments: (1) When $R_b$ is comparable to VCO tank $R_p$, then increases in $R_b$ help noise due to less tank loading until the noise of the resistor kicks in. This is the first local minimum of phase noise. (2) As $R_b$ keeps increasing, but the $R_b$ (Cvar+Ccouple) pole is still farther away than the frequency of interest, phase noise will increase (become worse). (3) As $R_b$ continues to increase, and $R_b$ (Cvar+Ccouple) approaches the offset frequency of interest, phase noise will become maximum (worst). As $R_b$ continues to increase, and $R_b$ (Cvar+Ccoup) pole becomes smaller than offset frequency of interest, phase noise will decrease and flatten out because $R_b$ not longer contributes to noise.

In one example of the fifth novel aspect, a varactor bias resistance of 2 k ohms gives optimal phase noise at a 1.25

MHz offset (or 0.9 MHz) as required for a CDMA1× system for PCS band (or Cell band) operation, whereas a varactor bias resistance of 100 k ohms gives optimal phase noise at a 45 MHz/80 MHz/190 MHz offset as required in a WCDMA system for Cell/PCS/IMT band operation. Accordingly, in the CDMA1× configuration the programmable varactor bias resistors are programmed to have a lower resistance of 2 k ohms, whereas in the WCDMA configuration the programmable varactor bias resistors are programmed to have a higher resistance of 100 k ohms.

In one specific embodiment, a cellular telephone includes a processor mechanism that has a cognizance of the wireless communication standard to be used or being used. The processor configures the analog PLL of the local oscillator for optimal performance depending on the communication standard. This configuration involves a configuration of the digitally programmable analog loop filter, a configuration of the digitally programmable VCO supply voltage circuit, a configuration of the programmable low pass varactor bias voltage filters of the digitally programmable VCO varactor bias control circuit, a configuration of the linear/nonlinear control circuitry of the digitally programmable VCO varactor bias control circuit, and a configuration of the programmable varactor bias resistor circuits of the digitally programmable VCO varactor bias control circuit. As the cellular telephone transitions from communicating using one communication standard to communicating using another communication standard, the processor reconfigures the analog PLL for optimal performance for the standard to be used. In this way, the same local oscillator and transceiver circuitry are usable to communicate signals of multiple standards.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 10 is a table that shows how the digitally programmable VCO supply voltage circuit of FIG. 9 is programmed when the PLL of FIG. 3 operates using different wireless communication standards.

FIG. 12 is a chart that shows how the VCO gain Kv varies as a function of VTUNE when the PLL of FIG. 3 operates using different wireless standards.

FIG. 13 is a table that sets forth how the digitally programmable VCO varactor bias control circuit can be programmed so that the VCO gain Kv versus VTUNE relationship can be made linear or nonlinear depending on the wireless communication standard being used.

FIG. 14 is a table that sets forth how the digitally programmable VCO varactor bias control circuit can be programmed to have different varactor bias filter bandwidths depending on the wireless communication standard being used.

FIG. 17 is a table that shows how the PLL of FIG. 3 is configured and how the VCO operates when the mobile communication device of FIG. 1 is operating to communicate CDMA1× signals, to communicate GSM signals, and to communicate WCDMA signals.

DETAILED DESCRIPTION

Figure 1:
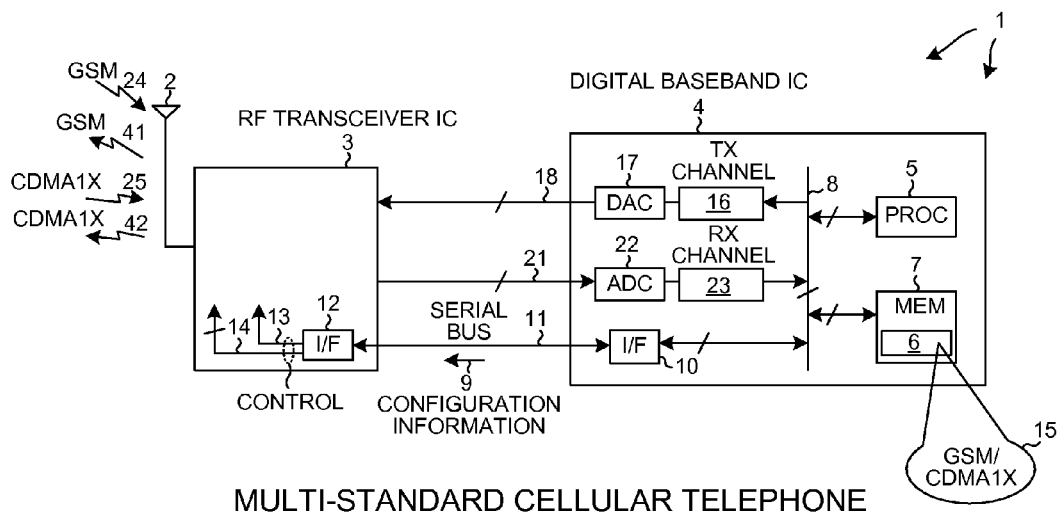
FIG. 1 is a diagram of a mobile communication device (for example, a cellular telephone) that includes a multi-standard local oscillator and associated transceiver circuitry usable for communicating both signals of a first wireless communication standard and signals of a second wireless communication standard.

FIG. 1 is a diagram of a mobile communication device 1 that includes a reconfigurable local oscillator and associated transceiver circuitry usable for wireless communication using multiple different wireless communication standards. The reconfigurable local oscillator includes a digitally programmable analog loop filter and a digitally programmable Voltage Controlled Oscillator (VCO). In this example, mobile communication device 1 is a cellular telephone handset. Device 1 includes (among other parts not illustrated) an antenna 2 usable for receiving and transmitting cellular telephone communications, an RF (Radio Frequency) transceiver integrated circuit 3, and a digital baseband processor integrated circuit 4. In some examples, the transceiver circuitry and the digital baseband circuitry are implemented on the same integrated circuit, but a two integrated circuit implementation is set forth here for illustration purposes.

Digital baseband integrated circuit 4 includes a processor 5 that executes a program 6 of processor-executable instructions. Program 6 is stored on a processor-readable medium 7 that in this case is a semiconductor memory. Processor 5 accesses memory 7 via local bus mechanism 8. Processor 5 interacts with and controls the RF transceiver integrated circuit 3 by sending appropriate configuration and control information 9 to integrated circuit 3 via serial bus interface 10, serial bus 11, serial bus interface 12, and groups of control conductors 13 and 14. Processor 5 is cognizant of which wireless communication standard is being used. Processor 5 in this example is cognizant of whether the system is communicating in accordance with a first wireless communication standard or is communicating in accordance with a second wireless communication standard. Callout 15 represents this cognizance on the part of the processor mechanism in the digital baseband processor integrated circuit 4. A GSM (Global System for Mobile Communications) standard is an example of the first wireless communication standard used in cellular telephone communications. A CDMA1× (Code Division Multiple Access 1×) standard is an example of the second wireless communication standard used in cellular telephone communications.

Information to be transmitted is encoded and modulated in a transmit channel 16 and is converted into digital form by a Digital-to-Analog Converter (DAC) 17 and is communicated across conductors 18 to the transmitter portion 19 of transceiver integrated circuit 3. Information received by the receive chain portion 20 of transceiver integrated circuit 3 is communicated in the opposite direction across conductors 21 from RF transceiver integrated circuit 3 to digital baseband processor integrated circuit 4. The information is converted into digital form by an Analog-to-Digital Converter (ADC) 22, and is demodulated and decoded in a receive channel 23. The encoding and modulating and demodulating and decoding is appropriate for the wireless communication standard being employed.

Figure 2:
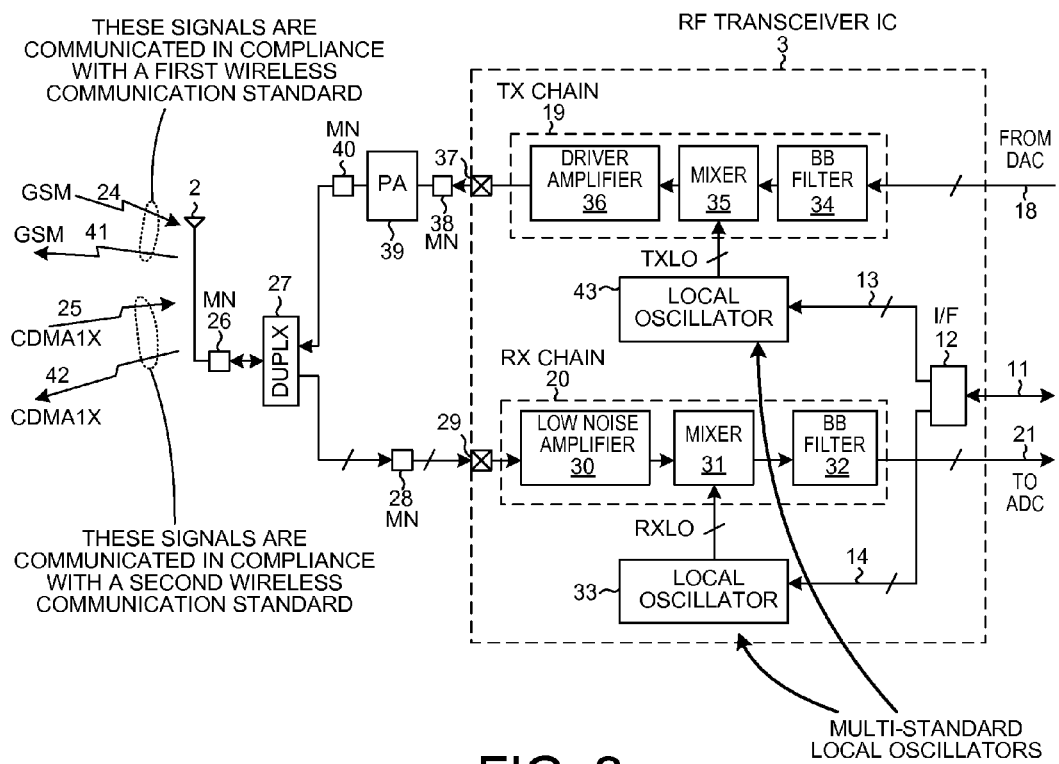
FIG. 2 is a more detailed diagram of the RF transceiver and antenna parts of the mobile communication device of FIG. 1.

FIG. 2 is a more detailed diagram of the transceiver and antenna parts of the cellular telephone of FIG. 1. In one very simplified explanation of the operation of the cellular telephone, if the cellular telephone of FIG. 1 is being used to receive information, then an incoming transmission is received on antenna 2. GSM wireless communication 24 is a first example of such an incoming transmission. CDMA1× wireless communication 25 is a second example of such an incoming transmission. The incoming signal passes through matching network 26, a duplexer 27, a matching network 28, terminals 29, a Low Noise Amplifier (LNA) 30, a mixer 31, a baseband filter 32, and conductors 21 to the ADC 22 within digital baseband processor integrated circuit 4. A local oscillator 33 (also referred to as a frequency synthesizer) supplies a receive local oscillator signal RXLO to mixer 31. How the receiver downconverts is controlled by changing the frequency of the local oscillator signal RXLO.

If, on the other hand, cellular telephone 1 is being used to transmit information, then the information to be transmitted is converted into analog form by DAC 17 in digital baseband processor integrated circuit 4. The analog information is supplied to a baseband filter 34 of the transmit chain portion 19 of the RF transceiver integrated circuit 3. After filtering by the baseband filter, the signal is upconverted in frequency by a mixer 35. The upconverted signal passes through driver amplifier 36, terminal 37, matching network 38, power amplifier 39, matching network 40, duplexer 22, and to antenna 2 for transmission. GSM wireless communication 41 is a first example of such a transmission. CDMA1× wireless communication 42 is a second example of such a transmission. How mixer 35 upconverts is controlled by changing the frequency of the local oscillator signal TXLO generated by a local oscillator 43 (also referred to as a frequency synthesizer).

The receive chain 20 is a part of transceiver circuitry usable to receive wireless communication signals 24 and 25. Local oscillator 33 generates the RXLO signal that is supplied to the receive chain 20 during this receiving operation. Similarly, the transmit chain 19 is a part of the transceiver circuitry usable to transmit wireless communication signals 41 and 42. Local oscillator 43 generates the TXLO signal that is supplied to the transmit chain 19 during this transmitting operation.

Figure 3:
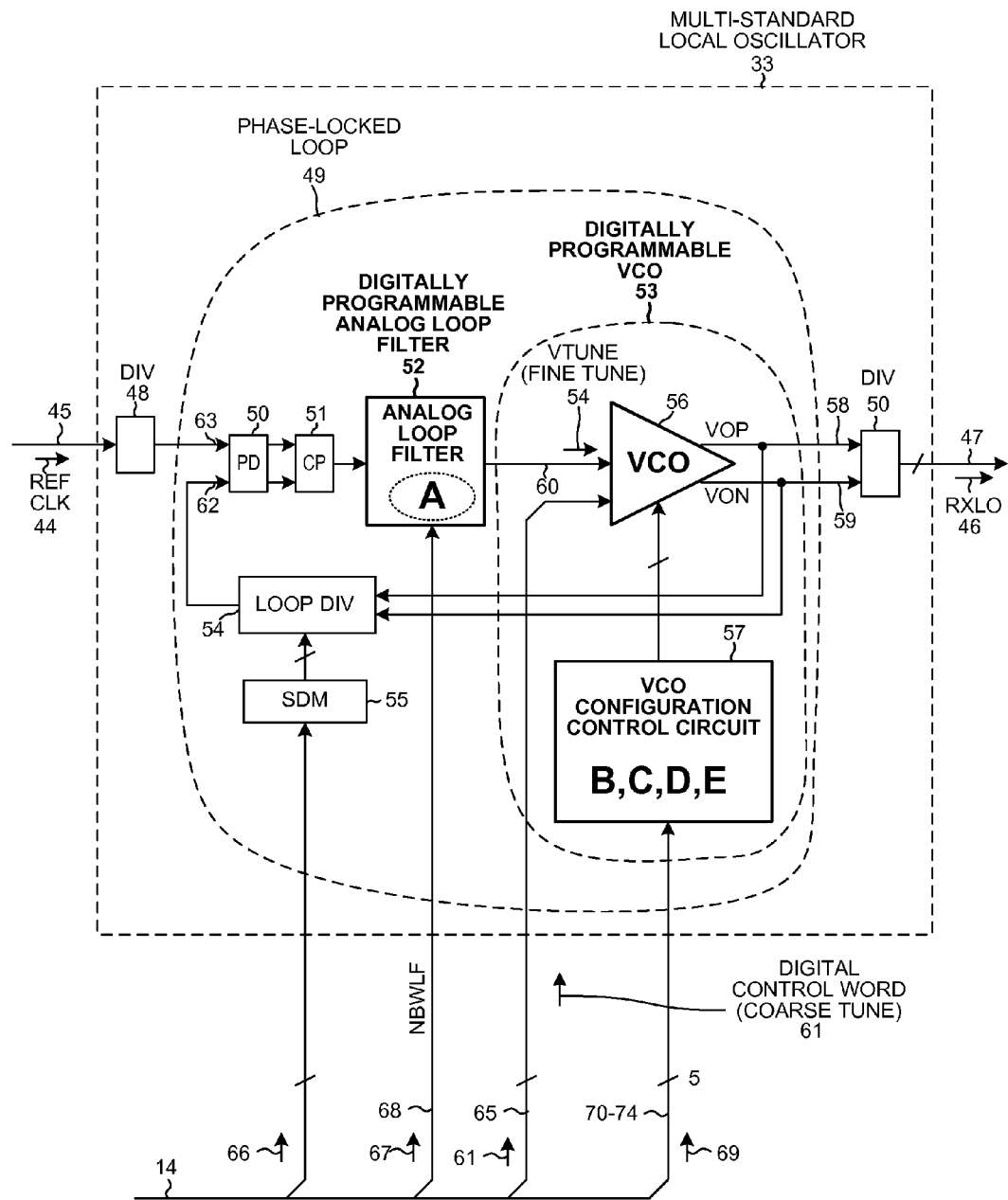
FIG. 3 is a more detailed diagram of the multi-standard local oscillator in the RF transceiver integrated circuit of FIG. 2.

FIG. 3 is a more detailed diagram of the local oscillator 33 of the RF transceiver integrated circuit 3 of FIG. 2. Local oscillator 33 receives a reference clock signal REF CLK 44 from a reference clock source via conductor 45. Local oscillator 33 outputs the RXLO signal 46 onto conductors 47. Local oscillator 33 includes a divider 48, a Phase-Locked Loop (PLL) 49, and an output divider 50. In this case the PLL 49 is an analog PLL and includes a phase detector 50, a charge pump 51, a digitally programmable analog loop filter 52, a digitally programmable VCO 53, a loop divider 54 and a Sigma-Delta Modulator (SDM) 55. Digitally programmable VCO 53 includes a VCO 56 and a VCO configuration control circuit 57. VCO 56 supplies a sinusoidal analog differential VCO output signal VOP and VON onto conductors 58 and 59, respectively. The oscillating frequency of the output signal of the VCO is determined by an fine tuning analog input signal VTUNE 60 and a coarse tuning multi-bit digital control word 61. When the PLL is in lock, the analog input signal VTUNE is adjusted by the loop filter 52 so that the phase of the VCO output signal, as divided down by loop divider 54 and supplied back onto a second input lead 62 of phase detector 50 matches the phase of the reference clock signal REF CLK as divided down by divider 48 and supplied onto a first input lead 63 of phase detector 50. The fine tuning VTUNE signal 60 on conductor 64 ranges from approximately 0.3 volts to 1.8 volts. Coarse tuning digital control word 61 on conductors 65 is part of a larger coarse tuning digital control word carried on conductors 14. Conductors 65 are some of the control conductors 14. Arrow 66 represents a portion of the larger coarse tuning digital control word that is supplied to the Sigma-Delta Modulator 55 of the PLL. Arrow 67 represents a portion of the larger coarse tuning digital control word that is supplied via conductor 68 to loop filter 52. This portion is the control bit NBWLF (narrow band width loop filter) as discussed further below. Conductor 68 is one of conductors 14. Arrow 69 represents a portion of the larger coarse tuning digital control word that is supplied via conductors 70-74 to VCO configuration control circuitry 57. This portion is the control bits MC1, MC2, LEN, NBW and RB as discussed further below.

Figure 4:
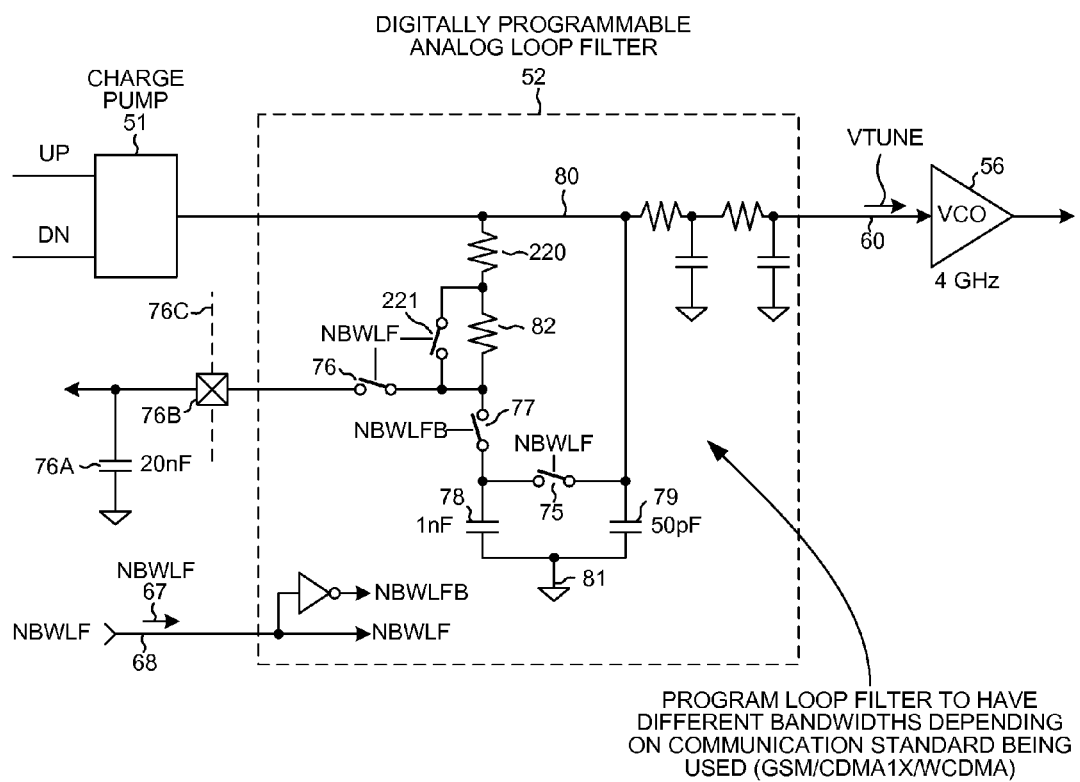
FIG. 4 is a simplified circuit diagram of the digitally programmable analog loop filter of the PLL in the multi-standard local oscillator of FIG. 3.

FIG. 4 is a simplified diagram of programmable analog loop filter 52 of FIG. 3. Loop filter 52 is an analog filter in that it is implemented with analog circuit components such as capacitors, resistors, and transistors used as switches. If the bandwidth control bit NBWLF (narrow band width loop filter) as received via conductor 68 has a digital logic high value, then switches 75, 76 and 221 are closed and switch 77 is open. Capacitors 78 and 79 are coupled in parallel between node 80 and ground conductor 81. A larger external capacitor 76A is coupled via integrated circuit terminal 76B, closed switch 76, closed switch 221 and resistor 220 to node 80. Terminal 76B has the dual purpose of also serving as a test terminal for monitoring or driving the VTUNE signal. Dashed line 76C represents the boundary of RF transceiver integrated circuit 3 and indicates that capacitor 76A is provided as a discrete component that is external to integrated circuit 3. If, on the other hand, the bandwidth control bit loop filter NBWLF has a digital logic low value, then switches 75, 76 and 221 are open and switch 77 is closed such that the capacitance of capacitor 78 is no longer coupled in parallel with the capacitance of capacitor 79. The larger external capacitor 76A is not used in this configuration. Rather, the smaller capacitor 78 is coupled via closed switch 77 and resistors 82 and 220 to node 80. The overall low pass loop filter 52 has a greater bandwidth when digital control bit NBWLF has a digital logic low value as compared to when it has a digital logic high value. The switch symbols in FIG. 4 can be implemented in any suitable way including, for example, as single N-channel transistors, as single P-channel transistors, or as transmission gates.

Figures 5, 6:
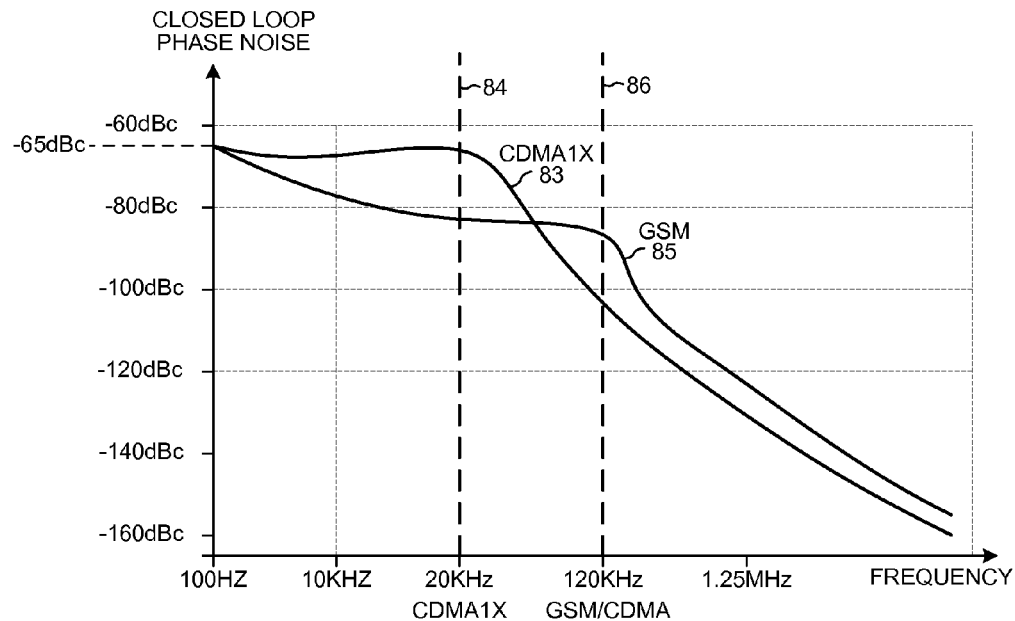
FIG. 5 is a chart that shows how adjusting bandwidth of the digitally programmable analog loop filter affects closed loop VCO phase noise.
FIG. 6 is a table that shows how the digitally programmable analog loop filter is programmed when the PLL of FIG. 3 operates using different wireless communication standards.

FIG. 5 is a chart that shows the effect of changing the bandwidth of programmable low pass loop filter 52 on the closed loop phase noise of the VCO. Line 83 represents the closed loop phase noise of VCO 56 when the digital control bit NBWLF has a digital logic value high. The closed loop phase noise begins to drop off at a cutoff frequency 84 of about 20 KHz. Line 85 represents the closed loop phase noise of VCO 56 when the digital control bit NBWLF a digital logic value low. The closed loop phase noise stays relatively constant and only begins to drop off at a cutoff frequency 86 of approximately 120 KHz.

FIG. 6 is a table that sets forth the loop filter settings of programmable loop filter 52. In one example, the digitally programmable analog loop filter 52 is programmed to have a particular desired bandwidth depending on the particular wireless standard to be communicated and this programmed bandwidth setting remains substantially unchanged throughout the time the transceiver is communicating using the wireless standard.

Figure 7:
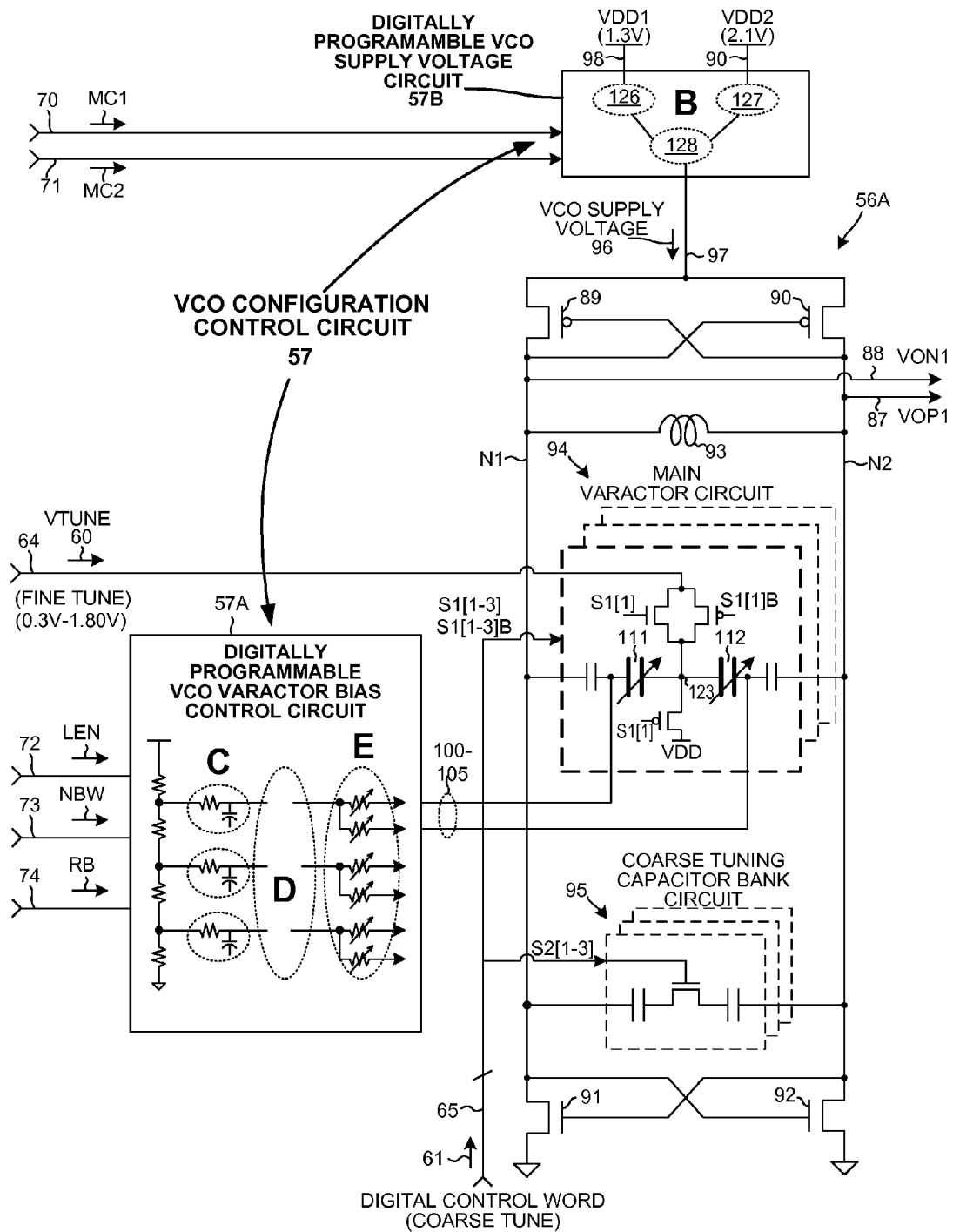
FIG. 7 is a more detailed diagram of the VCO, the digitally programmable VCO varactor bias control circuit, and the digitally programmable VCO supply voltage circuit within the PLL of FIG. 3.

FIG. 7 is a more detailed diagram of digitally programmable VCO 53 of FIG. 3. VCO 56 actually involves a first VCO portion 56A (often referred to as the VCO) and a VCO buffer 56B (see FIG. 9). VCO portion 56A receives the fine tuning signal VTUNE 60 via conductor 64 from the loop filter 52. VCO portion 56A receives the coarse tuning multi-bit digital control word 55 via conductors 65 from the serial bus interface 12. VCO portion 56A outputs an analog sinusoidal differential VCO output signal VOP1 and VON1 on nodes 87 and 88, respectively. Node 87 is also denoted as N2. Node 88 is also denoted as node N1. VCO portion 56A includes an amplifier portion and a resonator tank portion. The amplifier portion includes two cross-coupled P-channel transistors 89 and 90 and two cross-coupled N-channel transistors 91 and 92 as illustrated. The resonator tank portion includes an inductor 93, a main varactor circuit 94 and a coarse tuning capacitor bank circuit 95. The VCO configuration control circuit 57 can either be considered part of VCO 56 or it can be considered to be a separate associated circuit. Inductor 93, main varactor circuit 94 and coarse tuning capacitor bank circuit 95 are coupled together in parallel as illustrated between nodes N1 and N2. Digital control bits S1[1-3], S1[1-3]B and S2[1-3] are digital contro the coarse tuning digital control word 61.

VCO configuration control circuit 57 includes a VCO varactor bias control circuit portion 57A and a VCO supply voltage circuit portion 57B. VCO portion 56A receives a VCO supply voltage 96 via a supply input conductor and lead 97 from the VCO supply voltage circuit portion 57B. VCO supply voltage circuit portion 57B draws power from a selectable one of either a first voltage supply conductor and source VDD1 98 or a second voltage supply conductor and source VDD2 99. VCO supply voltage circuit 57B receives digital control bits MC1 and MC2 via conductors 70 and 71, respectively. VCO varactor bias control circuit portion 57A receives digital control bits LEN, NBW and RB via conductors 72-74, respectively. VCO varactor bias control circuit portion 57A supplies varactor bias voltages to the main varactor circuit 94 via conductors 100-105. Labels BVIAS1A, VBIAS1B, VBIAS2A, VBIAS2B, VBIAS3A and VBIAS3 indicate the varactor bias voltages.

Figure 8:
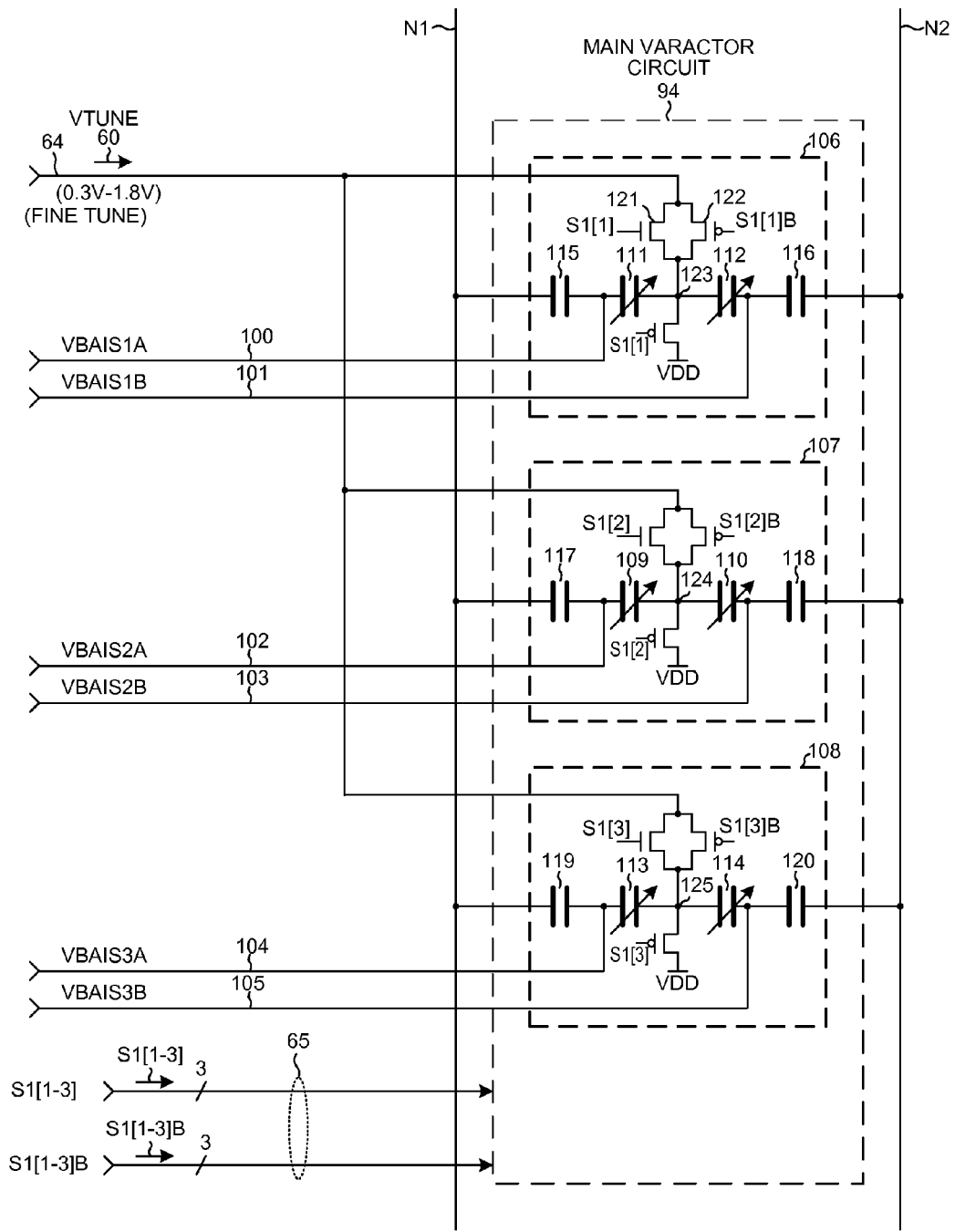
FIG. 8 is a more detailed diagram of the main varactor circuit in the VCO of FIG. 7.

FIG. 8 is a more detailed diagram of main varactor circuit 94 of FIG. 7. Main varactor circuit 94 includes a plurality of main varactor circuit portions 106-108. The main varactor circuit portions 106-108 are coupled together in parallel between conductors N1 and N2 as illustrated. The main varactor circuit portions 106-108 are of similar construction except that the sizes of the varactors in the main varactor circuit portions can be made to increase in a binary weighted fashion such that varactors 109 and 110 are twice as large as varactors 111 and 112, and such that varactors 113 and 114 are twice as large as varactors 109 and 110. The three digital control bits S1[1-3] and their complements S1[1-3]B are bits of the coarse tune digital control word 61 of FIG. 7. These bits S1[1-3] and S1[1-3]B are supplied to the main varactor circuit portions 106-108 as illustrated. The digital values of these digital bits determine which ones of the main varactor circuit portions are enabled and disabled. Capacitors 115-120 are AC coupling capacitors. Each main varactor circuit portion is AC coupled separately to the nodes N1 and N2 so that its varactors can be DC biased with different DC bias voltages if desired. Each of the main varactor circuit portions 106-108 has a transmission gate involving parallel-connected N-channel and P-channel transistors. To enable a particular main varactor circuit portion, the digital control bits S1[1-3] and S1[1-3]B are set such that the transmission gate of the main varactor circuit portion to be enabled is turned on and made conductive. The fine tune voltage signal VTUNE from conductor 64 can then drive the control node of the main varactor circuit portion, thereby controlling the amount of capacitance presented by the main varactor circuit portion between nodes N1 and N2. For example, in the case of main varactor circuit portion 106, the transmission gate involves N-channel transistor 121 and P-channel transistor 122 and the control node is identified with reference numeral 123. The control node of second main varactor circuit portion 107 is identified with reference numeral 124. The control node of third main varactor circuit portion 108 is identified with reference numeral 125.

Figure 9:
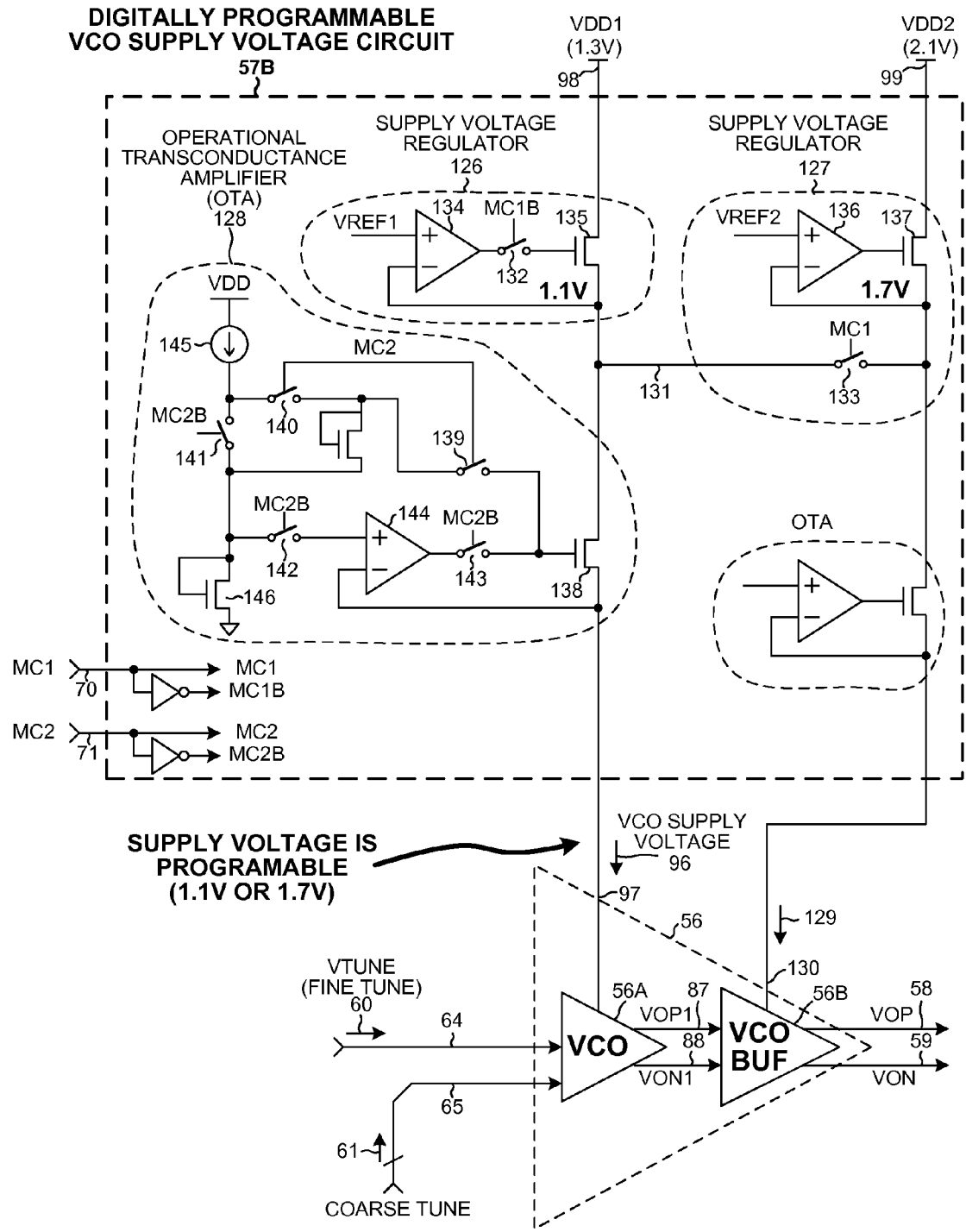
FIG. 9 is a more detailed circuit diagram of the digitally programmable VCO supply voltage circuit of FIG. 7.

FIG. 9 is a circuit diagram of the VCO supply voltage circuit 51B of FIG. 7. VCO supply voltage circuit 57B includes a first supply voltage regulator 126, a second supply voltage regulator 127, and an Operational Transconductance Amplifier (OTA) 128. VCO supply voltage circuit 57B draws current from a selectable one of the first supply voltage conductor 98 and the second supply voltage conductor 99 and supplies the regulated VCO supply voltage 96 onto the supply input lead and conductor 87 of VCO 56. VCO supply voltage circuit 57B also powers VCO buffer 56B by supplying a regulated supply voltage 129 to the VCO buffer 56B via supply input lead 130.

If digital control bit MC1 has a digital logic low value, then first supply voltage regulator 126 is enabled to draw power from first supply voltage conductor VDD1 98 and to supply a regulated voltage VREF1 onto node 131. Second supply voltage regulator 127 is disabled and is disconnected from node 131. Switch 132 is closed and switch 133 is open. Operational amplifier 134 and transistor 135 form a voltage regulator.

If digital control bit MC1 has a digital logic high value, then second supply voltage regulator 127 is enabled to draw power from second supply voltage conductor VDD2 99 and to supply a regulated voltage VREF2 onto node 131. First supply voltage regulator 126 is disabled and is disconnected from node 131. Switch 133 is closed and switch 132 is open. Operational amplifier 136 and transistor 137 form a voltage regulator. In one example, the first supply voltage VDD1 is 1.3 volts, VREF1 is 1.1 volts, the second supply voltage VDD2 is 2.1 volts, and VREF2 is 1.7 volts.

If digital control bit MC2 has a digital logic high value, then OTA 128 is disabled and is bypassed such that transistor 138 is controlled to be fully on. Node 131 is coupled to supply input lead 97 of the VCO supply voltage circuit portion 57B. The voltage on the gate of transistor 138 is a digital logic high voltage because switches 139 and 140 are closed. Switches 141, 142 and 143 are open, thereby disabling the amplifier by disconnecting the output of operational amplifier 144 from the gate of transistor 138. If, on the other hand, digital control bit MC2 has a digital logic low value, then OTA 128 is enabled. Switches 139 and 140 are open and switches 141-

143 are closed. Current source 145 and transistor 146 bias the voltage on the noninverting input lead of operational amplifier 144.

FIG. 10 is a table that sets forth an operation of the VCO supply voltage circuit 57B of FIG. 9.

Figure 11:
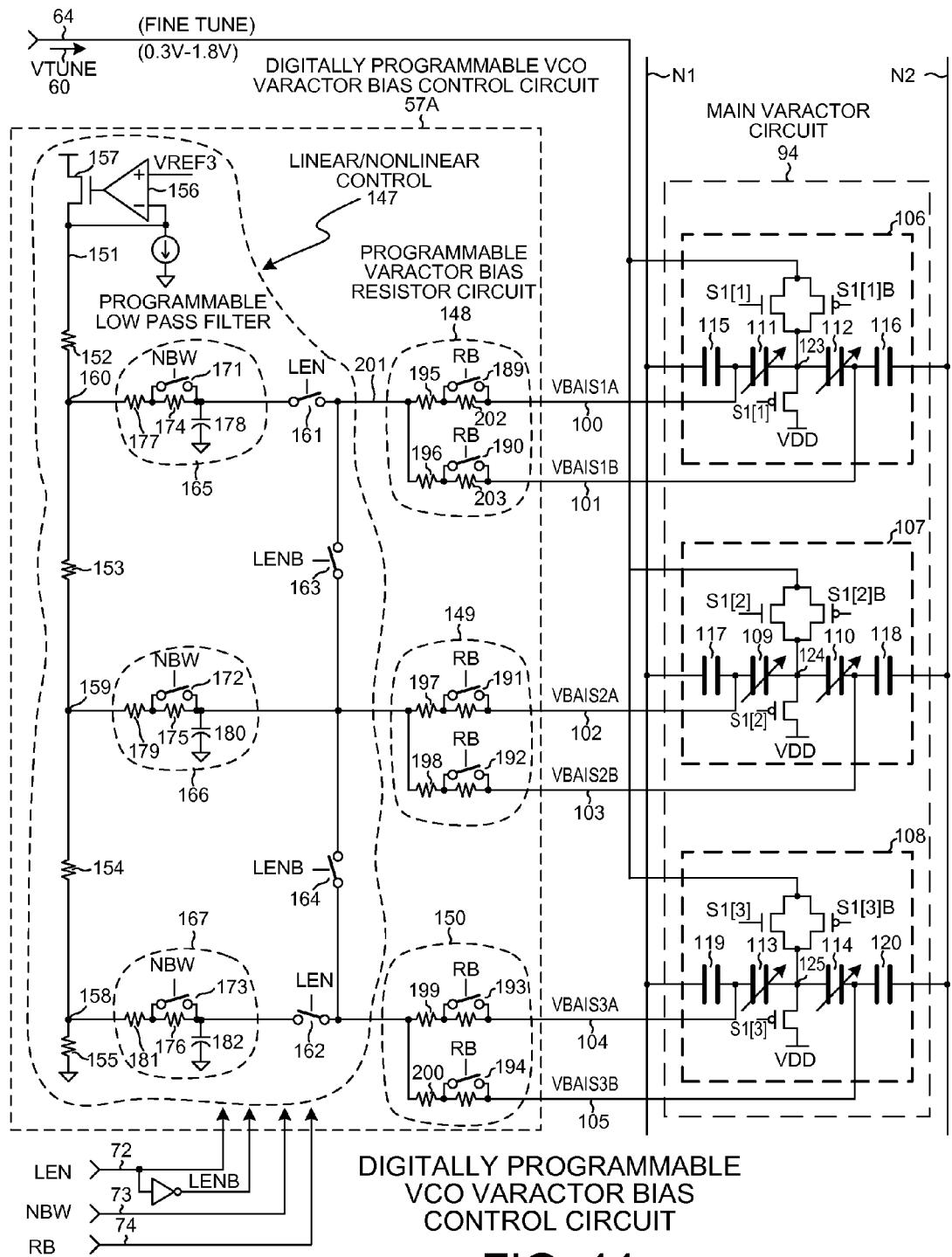
FIG. 11 is a more detailed circuit diagram of the digitally programmable VCO varactor bias control circuit of FIG. 7.

FIG. 11 is a more detailed diagram of the VCO varactor bias control circuit 57A of FIG. 7. VCO varactor bias control circuit 57A includes a linear/nonlinear control portion 147, and a set of programmable varactor bias resistor circuits 148-150. Linear/nonlinear control portion 147 includes a circuit that sets a voltage reference VREF3 at the top 151 of a voltage dividing resistor string 152-155. The circuit that sets the voltage reference VREF3 involves operational amplifier 156 and transistor 157. The resistor string sets voltages VREF3(1/4), VREF3(2/4) and VREF3(3/4) on taps 158, 159 and 160 of the resistor string, respectively. If digital control bit LEN has a digital logic high value, then switches 161 and 162 are closed and switches 163 and 164 are open. Accordingly, the DC voltage from tap 160 of the resistor string is supplied through programmable low pass filter 165, closed switch 161, and programmable varactor bias resistor circuit 148 to main varactor circuit portion 106 so as to DC bias the varactors 111 and 112. Similarly, the DC voltage from tap 159 of the resistor string is supplied through programmable low pass filter 166 and programmable varactor bias resistor circuit 149 to main varactor circuit portion 107 so as to DC bias the varactors 109 and 110. The DC voltage from tap 158 of the resistor string is supplied through programmable low pass filter 167 and programmable varactor bias resistor circuit 150 to main varactor circuit portion 108 so as to DC bias the varactors 113 and 114. In this setting of the linear/nonlinear control circuit 147, the DC bias voltages supplied to the varactors of the various main varactor circuit portions are spaced evenly between ground potential and VREF3 as determined by the resistances of the resistors in the resistor string. By setting digital control bit LEN to a digital logic high value, this set of DC bias voltages is supplied to the main varactor circuit portions.

In, on the other hand, digital control bit LEN has a digital logic low value, then switches 161 and 162 are open and switches 163 and 164 are closed. The voltages on the input leads of the programmable varactor bias resistor circuits 148-150 are the same because these input leads are all shorted together by conductive switches 163 and 164. The DC bias voltage from tap 159 is supplied via programmable low pass filter 166 and programmable varactor bias resistor circuits 148-150 to the varactors of all the main varactor circuit portions 106-108. By setting digital control bit LEN to a digital logic low value, this set of DC bias voltages (all the same voltage from tap 159) is supplied to the main varactor circuit portions.

FIG. 12 is a diagram that illustrates operation of the VCO when the linear/nonlinear control portion 147 is set in its linear setting (LEN=1) and when it is set in its nonlinear setting (LEN=0). As indicated by line 168, when in the linear setting the gain Kv of VCO 56 is linear for VTUNE voltages in the operational range of from 0.3 volts to 1.8 volts. As indicated by line 169, when in the nonlinear setting the gain Kv of VCO 56 is nonlinear for VTUNE voltages in the operational range of from 0.3 volts to 1.8 volts. In the nonlinear setting, gain Kv has a peak 170 at a VTUNE of 0.7 volts and this peak Kv value 170 is higher than the Kv value when the linear/nonlinear control portion 147 is set in its linear setting.

FIG. 13 is a table that shows how the linear/nonlinear control portion 147 is made to operate in the linear setting if digital control bit LEN has a digital logic high value, whereas the linear/nonlinear control portion 147 is made to operate in the nonlinear setting if digital control bit LEN has a digital logic low value.

VCO varactor bias control circuit 57A of FIG. 7 is not only programmable into a linear mode or into a nonlinear mode, but it is also programmable such that its low pass varactor bias filters 165-167 can have a selectable one of two different bias filter bandwidths. In FIG. 11, reference numerals 165-167 identify the programmable low pass varactor bias filters. These filters are RC filters. If digital control bit NBW has a digital logic high value, then switches 171-173 are closed. Each RC filter has a lower resistance R value and consequently the RC filter has a narrower bandwidth. The resistors 174-176 are shorted out of the RC filters. Programmable low pass varactor bias filter 165 involves the resistance of resistor 177 and the capacitance of capacitor 178. Programmable low pass filter 166 involves the resistance of resistor 179 and the capacitance of capacitor 180. Programmable low pass filter 167 involves the resistance of resistor 181 and the capacitance of capacitor 182. If, on the other hand, digital control bit NBW has a digital logic low value, then switches 171-173 are open. Each RC filter has a higher resistance R value and consequently the RC filter has a wider bandwidth. Programmable low pass varactor bias filter 165 involves the resistance of resistors 177 and 174 and the capacitance of capacitor 178. Programmable low pass filter 166 involves the resistance of resistors 179 and 175 and the capacitance of capacitor 180. Programmable low pass filter 167 involves the resistance of resistors 181 and 176 and the capacitance of capacitor 182.

FIG. 14 is a table that shows how changing the varactor bias filter settings changes operation of the VCO. If digital control bit NBW has a digital logic high value, then VCO 56 has a slower setting time but there is less noise in the varactor bias voltages supplied to the main varactor. If digital control bit NBW has a digital logic low value, then VCO 56 has a faster setting time but there is more noise in the varactor bias voltages supplied to the main varactor.

Figures 15, 16:
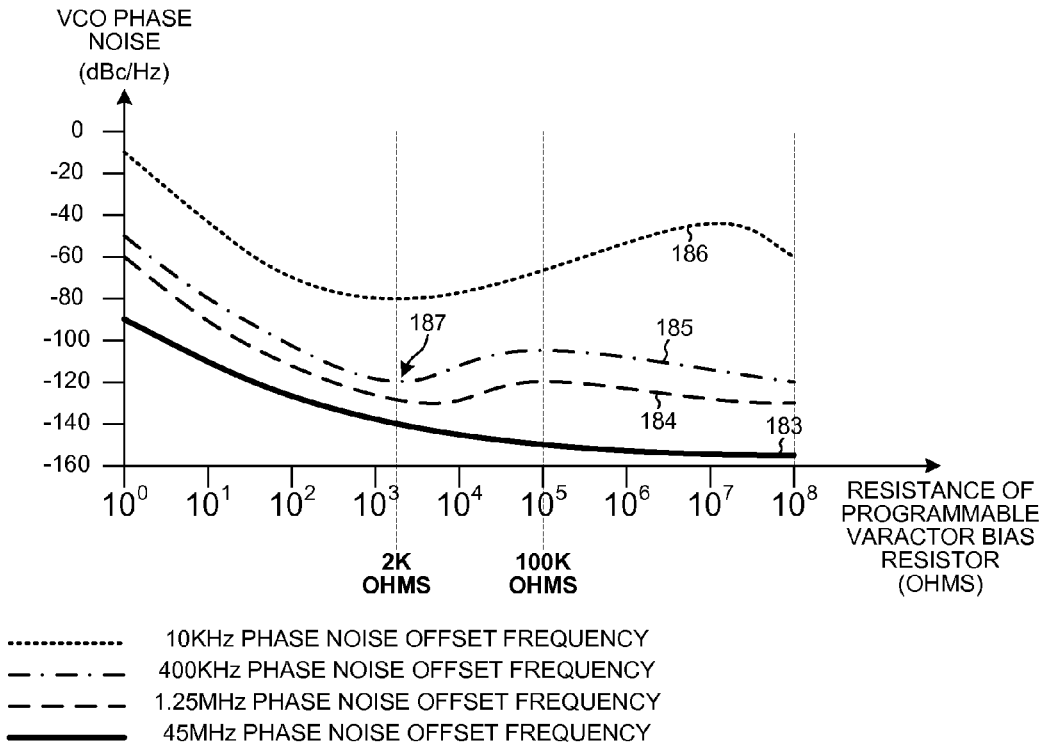
FIG. 16 is a chart that shows how the resistance of the programmable varactor bias resistor circuits can be programmed to minimize VCO phase noise depending on the wireless communication standard being used.

FIG. 15 is a chart that shows how VCO phase noise varies as a function of varactor bias resistance. The bias resistance through which the main varactors are DC biased contributes to VCO phase noise. In order to minimize VCO phase noise, a first DC bias resistor value may be optimal for a first offset frequency whereas a second DC bias resistor value may be optimal for a second offset frequency. In FIG. 15, lines 183-186 show how phase noise varies as a function of the resistance of the DC bias resistors for offset frequencies of 45 MHz, 1.25 MHz, 400 KHz and 10 KHz, respectively. As indicated by line 183 the lowest VCO phase noise for a 45 MHz offset frequency is achieved using a higher varactor bias resistance. Increasing the varactor bias resistance to 100 k ohms or more decreases phase noise below −140 dBc. As indicated by lines 184-186, the lowest phase noise for lower offset frequencies of 1.25 MHz and lower is achieved using a lower varactor bias resistance. For example, the minima 187 of the curve 185 occurs at approximately 2 k ohms. In accordance with one novel aspect, the VCO varactor bias control circuit 57A is made to have a programmable DC bias resistors. The DC bias resistance through which the VCO varactor bias control circuit 57A drives the main varactor is a selectable one of two resistances, 100 k ohms and 2 k ohms.

FIG. 16 is a table that sets forth the two varactor bias resistor settings of VCO varactor bias control circuit 57A. If the digital control bit RB (bias resistance) has a digital logic high value, then switches 189-194 are closed. The resistance through which the varactor bias resistor circuits supply the DC bias voltages to the varactors is the resistance of resistors 195-200. If the digital control bit RB has a digital logic low value, then tches 189-194 are open and the resistance through which the varactor bias resistor circuits supply the DC bias voltages to the varactors is the resistance of series-connected resistors of the circuit. For example, the resistance from node 201 to conductor 100 is the sum of the resistance of resistor 195 and the resistance of resistor 202. The resistance from node 201 to conductor 101 is the sum of the resistance of resistor 196 and the resistance of resistor 203. In the present example, all the programmable varactor bias resistor circuits 148-150 are of identical construction and operation and involve the same resistor values.

FIG. 17 is a table that shows how the digitally programmable analog loop filter 52 and the digitally programmable VCO 53 of the multi-standard local oscillator 33 FIG. 3 are programmed in one example to achieve superior VCO performance when the transceiver circuitry of FIG. 2 is communicating a first signal in accordance with a first wireless communication standard (for example, is receiving a CDMA1× signal), when the transceiver circuitry of FIG. 2 is communicating a second signal in accordance with a second wireless communication standard (for example, is receiving a GSM signal), and when the transceiver circuitry of FIG. 2 is communicating a signal in accordance with a third wireless communication standard (for example, is receiving a WCDMA signal). For example, the processor 5 within the digital baseband processor integrated circuit 4 can configure the RF transceiver integrated circuit 3 to receive a CDMA1× signal by sending configuration information 9 across serial bus 11 that results in the digital control values NBWLF, MC1, MC2, LEN, NBW and RB having the values [110011], and the processor 5 can then reconfigure the RF transceiver integrated circuit 3 to receive a GSM signal by sending configuration information 9 across serial bus 11 that results in the digital control values NBWLF, MC1, MC2, LEN, NBW and RB having the values [010101], and the processor 5 can then reconfigure the RF transceiver integrated circuit 3 to receive a WCDMA signal by sending configuration information 9 across serial bus 11 that results in the digital control values NBWLF, MC1, MC2, LEN, NBW and RB having the values [001100]. In all three cases, the signals received pass through the same LNA 30, the same mixer 31, and the same base band filter 32, where the mixer 31 is supplied with an appropriate local oscillator signal RXLO by the same local oscillator 33.

The multi-standard cellular telephone of FIG. 1 is capable of being configured to communicate signals of a selected one of three wireless communication standards referred to here generally as GSM, CDMA1× and WCDMA. These names of standards are not being used in their strictest technical sense but rather are used to describe three general classes of communication signals that are governed by three corresponding different sets of requirements and specifications. The use of a single reconfigurable analog PLL involving a digitally programmable analog loop filter and a digitally programmable VCO, where the PLL is part of a local oscillator that supplies a local oscillator signal to a receive chain or transmit chain, where that same receive chain or transmit chain is used to communicate signals of multiple standards is not limited to situations where the different signals communicated are GSM, CDMA1× or WCDMA signals. Rather, the techniques described above are applicable multi-standard transceiver operation where the transceiver communicates signals that comply with one or more other wireless communication standards.

Figure 18:
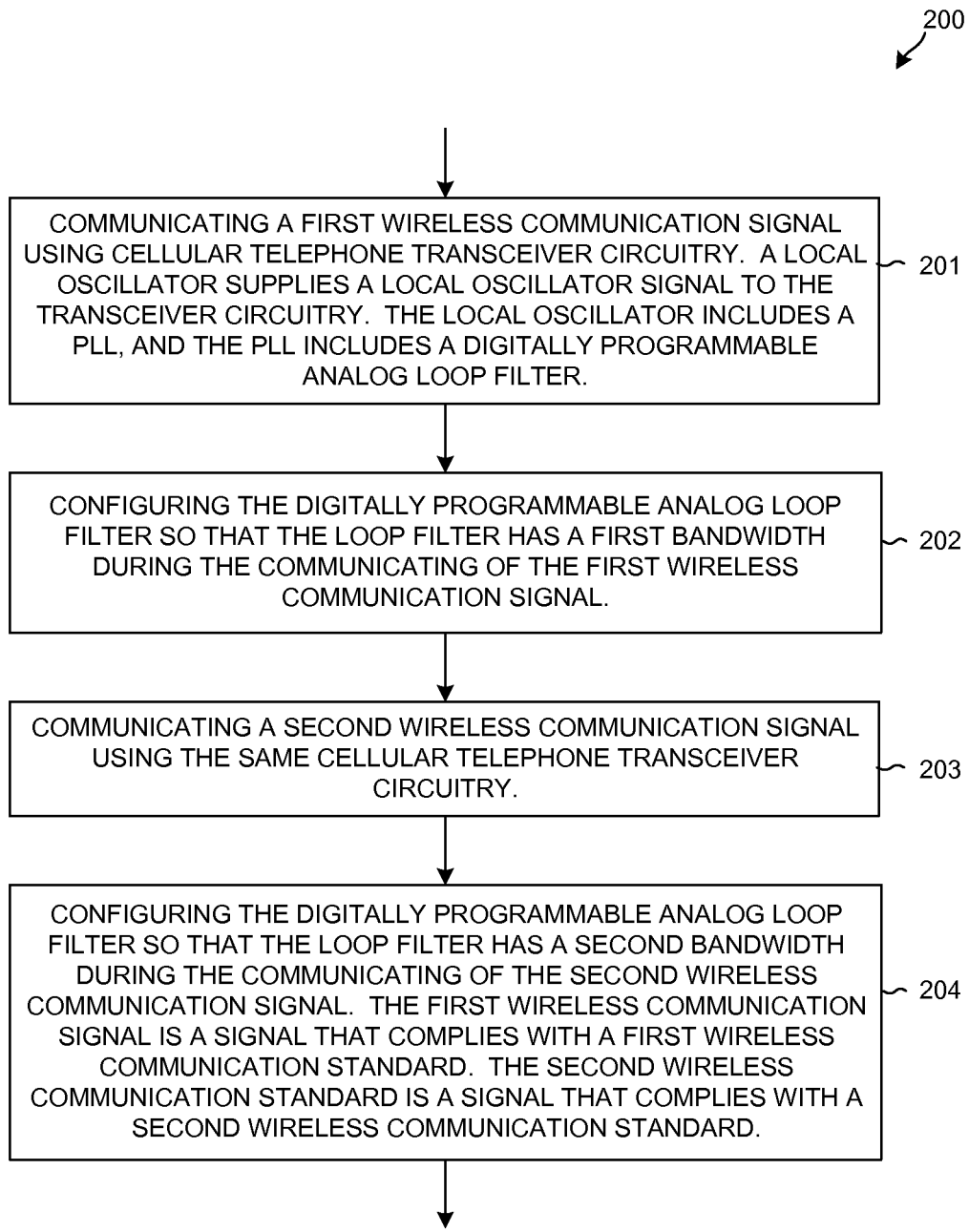
FIG. 18 is a flowchart of a method in accordance with one novel aspect.

FIG. 18 is a flowchart of a method 200 in accordance with one novel aspect. A first wireless communication signal is communicated (step 201) using cellular telephone transceiver circuitry. A local oscillator supplies a local oscillator signal to the transceiver circuitry. The local oscillator includes a PLL and the PLL includes a digitally programmable analog loop filter. The digitally programmable analog loop filter is configured (step 202) so that during the communicating of the first wireless communication signal by the transceiver circuitry the loop filter has a first bandwidth. A second wireless communication signal is then communicated (step 203) using the same cellular transceiver circuitry and the same local oscillator. The digitally programmable analog loop filter is configured (step 204) so that during the communicating of the second wireless communication signal by the transceiver circuitry the loop filter has a second bandwidth. In one example, the first and second wireless communication signals are different signals taken from the group consisting of: a GSM signal, a CDMA1× signal and a WCDMA signal. In one example of method 200, the first wireless communication signal is a CDMA1× signal and the first bandwidth is a relatively narrow bandwidth (for example, approximately 20 KHz), whereas the second wireless communication signal is a GSM signal and the second bandwidth is a relatively wide bandwidth (for example, approximately 120 KHz). The configuring of steps 202 and 204 is automatic and is done by processor 5 sending appropriate configuration information 9 across serial bus 11 such that the digitally programmable analog loop filter 52 is configured in the appropriate one of the settings as set forth in the table of FIG. 6.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, digitally programmable analog loop filter 52 and digitally programmable VCO 53 of FIG. 3 are controlled by software and/or firmware executing in digital baseband processor integrated circuit 4. The software and/or firmware may, for example, be the program 6 of processor-executable instructions that is stored in processor-readable medium 7. Processor 5 executes this program 6 of instructions and as a result controls the digitally programmable analog loop filter 52 and the digitally programmable VCO 53 in RF transceiver integrated circuit 3 by sending appropriate digital control information across serial bus 11.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. An apparatus comprising:
   transceiver circuitry usable to communicate a first wireless communication signal and a second wireless communication signal, wherein the first wireless communication signal complies with a first wireless communication standard, and wherein the second wireless communication signal complies with a second wireless communication standard; and
   a local oscillator that generates a local oscillator signal that is supplied to the transceiver circuitry, wherein the local oscillator comprises a Phase-Locked Loop (PLL) that includes a digitally programmable analog loop filter, and a digitally programmable Voltage-Controlled Oscillator (VCO) comprising a VCO and a digitally programmable VCO supply voltage circuit that draws power from a first supply voltage conductor and supplies a first regulated voltage to the VCO when the transceiver circuitry is communicating the first wireless communication signal, wherein the digitally programmable VCO supply voltage circuit draws power from a second supply voltage conductor and supplies a second regulated voltage to the VCO when the transceiver circuitry is communicating the second wireless communication signal.

2. The apparatus of claim 1, wherein the first and second wireless communication standards are different standards taken from the group consisting of: a GSM standard, a CDMA1x standard, and a WCDMA standard.

3. The apparatus of claim 1, wherein the transceiver circuitry includes a mixer that receives the local oscillator signal, wherein the transceiver circuitry communicates the first wireless communication signal by transmitting the first wireless communication signal from an antenna, wherein the transceiver circuitry communicates the second wireless communication signal by transmitting the second wireless communication signal from the antenna, wherein the first wireless communication standard is a GSM communication standard, and wherein the second wireless communication standard is a CDMA1x communication standard.

4. The apparatus of claim 1, wherein the transceiver circuitry includes a mixer that receives the local oscillator signal, wherein the transceiver circuitry communicates the first wireless communication signal by receiving the first wireless communication signal from an antenna, wherein the transceiver circuitry communicates the second wireless communication signal by receiving the second wireless communication signal from the antenna, wherein the first wireless communication standard is a GSM communication standard, and wherein the second wireless communication standard is a CDMA1x communication standard.

5. A method comprising:
   (a) receiving a first wireless communication signal, wherein said receiving involves downconverting the first wireless communication signal using a mixer, wherein a Phase-Locked Loop (PLL) is used to generate a local oscillator signal supplied to the mixer during the receiving of the first wireless communication signal, and wherein the PLL includes a digitally programmable analog loop filter and a digitally programmable Voltage Controlled Oscillator (VCO) comprising a VCO and a digitally programmable VCO supply voltage circuit;
   (b) receiving a second wireless communication signal, wherein said receiving of (b) involves downconverting the second wireless communication signal using the mixer;
   (c) configuring the digitally programmable VCO supply voltage circuit so that the digitally programmable VCO supply voltage circuit draws power from a first supply voltage conductor and supplies a first regulated voltage to the VCO when the first wireless communication signal is being received in (a); and
   (d) configuring the digitally programmable VCO supply voltage circuit so that the digitally programmable VCO supply voltage circuit draws power from a second supply voltage conductor and supplies a second regulated voltage to the VCO when the second wireless communication signal is being received in (b),
   wherein the first wireless communication signal complies with a first wireless communication standard, wherein the second wireless communication signal complies with a second wireless communication standard.

6. A method comprising:
   (a) transmitting a first wireless communication signal, wherein said transmitting involves upconverting the first wireless communication signal using a mixer, wherein a Phase-Locked Loop (PLL) is used to generate a local oscillator signal supplied to the mixer during the transmitting of the first wireless communication signal, and wherein the PLL includes a digitally programmable analog loop filter and a digitally programmable Voltage Controlled Oscillator (VCO) comprising a VCO and a digitally programmable VCO varactor bias control circuit;
   (b) transmitting a second wireless communication signal, wherein said transmitting of (b) involves upconverting the second wireless communication signal using the mixer; and
   (c) configuring the digitally programmable VCO varactor bias control circuit so that a plurality of DC varactor bias voltage signals supplied to a corresponding plurality of varactor circuit portions of the VCO have a first set of DC voltages when the first wireless communication signal is being transmitted in (a); and
   (d) configuring the digitally programmable VCO varactor bias control circuit so that the plurality of DC varactor bias voltage signals have a second set of DC voltages when the second wireless communication signal is being transmitted in (c),
   wherein the first wireless communication signal complies with a first wireless communication standard, wherein the second wireless communication signal complies with a second wireless communication standard.

7. An apparatus comprising:
   receiver circuitry involving a mixer that receives a local oscillator signal from a local oscillator, wherein the local oscillator involves a Phase-Locked Loop (PLL) including a means for analog loop filtering and for supplying a tuning signal to a digitally programmable Voltage Controlled Oscillator (VCO) of the PLL, the digitally programmable VCO comprising a VCO and means for outputting a plurality of varactor bias voltages, wherein each of the varactor bias voltages is supplied to a corresponding respective varactor circuit portion of the VCO through a corresponding respective means for low pass filtering, wherein the means for low pass filtering are programmed in a first way when the receiver circuitry is receiving a first wireless communication signal complying with a first wireless communication standard, wherein the means for low pass filtering are programmed in a second way when the receiver circuitry is receiving a second wireless communication signal complying with a second wireless communication standard.

8. The apparatus of claim 7, wherein the means for analog loop filtering is a digitally programmable analog loop filter that receives a digital control value.

9. An apparatus comprising:
transmitter circuitry involving a mixer that receives a local oscillator signal from a local oscillator, wherein the local oscillator involves a Phase-Locked Loop (PLL) including a means for analog loop filtering and for supplying a tuning signal to a digitally programmable Voltage Controlled Oscillator (VCO) of the PLL, the digitally programmable VCO comprising a VCO and means for outputting a plurality of varactor bias voltages, wherein the plurality of varactor bias voltages includes multiple different voltages when the transmitter circuitry is communicating a first wireless communication signal complying with a first wireless communication standard, wherein the plurality of varactor bias voltages are all the same voltage when the transceiver circuitry is communicating a second wireless communication signal complying with a second wireless communication standard.

10. The apparatus of claim 9, wherein the means for analog loop filtering is a digitally programmable analog loop filter that receives a digital control value.

11. An integrated circuit comprising:
receiver circuitry usable to receive a first wireless communication signal and a second wireless communication signal, wherein the first wireless communication signal complies with a first wireless communication standard, wherein the second wireless communication signal complies with a second wireless communication standard, wherein the receiver circuitry includes a Phase-Locked Loop (PLL) used in a generation of a local oscillator signal during both a receiving of the first wireless communication signal by the receiver circuitry and a receiving of the second wireless communication signal by the receiver circuitry, and wherein the PLL includes a digitally programmable analog loop filter and a digitally programmable Voltage-Controlled Oscillator (VCO) comprising a VCO comprising a plurality of varactor circuit portions, the digitally programmable VCO further comprising a digitally programmable VCO varactor bias control circuit that outputs a plurality of varactor bias voltages, wherein each varactor bias voltage is supplied to a corresponding one of the varactor circuit portions through a corresponding pair of programmable varactor bias resistors, wherein each of the digitally programmable varactor bias resistors is programmed to have a first resistance when the receiver circuitry is receiving the first wireless communication signal, and wherein each of the digitally programmable varactor bias resistors is programmed to have a second resistance when the receiver circuitry is receiving the second wireless communication signal.

12. The integrated circuit of claim 11, wherein the receiver circuitry includes a low noise amplifier, a mixer, a base band filter, and a local oscillator, wherein the PLL is a part of the local oscillator, and wherein the local oscillator signal is output by the local oscillator and is supplied to the mixer.

13. The apparatus of claim 1, wherein the digitally programmable analog loop filter has a first bandwidth when the transceiver circuitry is communicating the first wireless signal and has a second bandwidth when the transceiver circuitry is communicating the second wireless signal.

14. The method of claim 5, further comprising configuring the digitally programmable analog loop filter so that the digitally programmable loop filter has a first bandwidth during the receiving of (a).

15. The method of claim 14, further comprising configuring the digitally programmable analog loop filter so that the digitally programmable loop filter has a second bandwidth during the receiving of (b).

16. The method of claim 6, further comprising configuring the digitally programmable analog loop filter so that the digitally programmable loop filter has a first bandwidth during the transmitting of (a), and configuring the digitally programmable analog loop filter so that the digitally programmable loop filter has a second bandwidth during the transmitting of (b).

17. The method of claim 6, wherein in the first and second wireless communication standards are different standards selected from the group consisting of: a GSM standard, a CDMA1x standard, and a WCDMA standard.

18. The apparatus of claim 7, wherein one or more of the means for low pass filtering comprises a digitally programmable low pass filter.

19. The apparatus of claim 9, wherein the means for outputting comprises a digitally programmable VCO varactor bias control circuit.

20. The integrated circuit of claim 11, further comprising means controlling the digitally programmable analog loop filter to have a first bandwidth during the receiving of the first wireless communication signal and to have a second bandwidth during the receiving of the second wireless communication signal based at least in part on the respective first and second wireless communication standards.

21. The apparatus of claim 13, wherein the transceiver circuitry is operable to communicate the first wireless communication signal during a first time period when the digitally programmable analog loop filter has the first bandwidth, and wherein the transceiver circuitry is operable to communicate the second wireless communication signal during a second time period when the digitally programmable analog loop filter has the second bandwidth.

22. The integrated circuit of claim 20, wherein the means includes a conductor that carries a digital control value to the digitally programmable analog loop filter.

23. The integrated circuit of claim 22, wherein the means further includes a serial bus interface.

\* \* \* \* \*